United States Patent

Ok et al.

(10) Patent No.: US 9,484,401 B2
(45) Date of Patent: Nov. 1, 2016

(54) CAPACITANCE REDUCTION FOR ADVANCED TECHNOLOGY NODES

(71) Applicant: International Business Machines Corporation, Armonk, NY (US)

(72) Inventors: Injo Ok, Loudonville, NY (US); Balasubramanian Pranatharthiharan, Watervliet, NY (US); Charan Veera Venkata Satya Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/551,279

(22) Filed: Nov. 24, 2014

(65) Prior Publication Data

US 2016/0148999 A1    May 26, 2016

(51) Int. Cl.
| | | |
|---|---|---|
| *H01L 29/06* | (2006.01) | |
| *H01L 29/417* | (2006.01) | |
| *H01L 29/78* | (2006.01) | |
| *H01L 29/66* | (2006.01) | |

(52) U.S. Cl.
CPC ..... *H01L 29/0649* (2013.01); *H01L 29/41783* (2013.01); *H01L 29/66795* (2013.01); *H01L 29/785* (2013.01)

(58) Field of Classification Search
CPC ............. H01L 21/76841; H01L 21/76892; H01L 29/41783; G06F 2217/12
USPC ........................................ 438/256; 257/382
See application file for complete search history.

(56) References Cited

U.S. PATENT DOCUMENTS

| | | | | |
|---|---|---|---|---|
| 5,164,330 A | * | 11/1992 | Davis | H01L 21/32115 257/E21.303 |
| 7,323,410 B2 | | 1/2008 | Standaert et al. | |
| 2002/0072223 A1 | * | 6/2002 | Gilbert | H01L 21/32051 438/629 |
| 2008/0217775 A1 | | 9/2008 | Pai et al. | |
| 2012/0223398 A1 | * | 9/2012 | Zhong | H01L 21/76816 257/411 |
| 2015/0206942 A1 | * | 7/2015 | Glass | H01L 29/36 257/335 |

* cited by examiner

*Primary Examiner* — Caridad Everhart
(74) *Attorney, Agent, or Firm* — Scully, Scott, Murphy & Presser, P.C.; Steven J. Meyers

(57) ABSTRACT

After forming source/drain contact trenches to expose source/drain regions, contact liner material layer portions are formed on sidewalls and bottom surfaces of the source/drain contact trenches. Contact material layer portions are then formed over the contact liner material layer portions to fill in the source/drain contact trenches. At least portions of the contact material layer portions and the contact liner material layer portions present on sidewalls of the source/drain contact trenches are removed to provide source/drain contacts with reduced contact capacitance.

18 Claims, 13 Drawing Sheets

CAPACITANCE REDUCTION FOR ADVANCED TECHNOLOGY NODES

BACKGROUND

The present application relates to semiconductor device fabrication, and more particularly, to a method of forming a source contact and a drain contact (collectively referred to hereinafter as source/drain contacts) with reduced contact capacitance.

Field Effect Transistors (FETs) are essential components of all modern electronic products. FETs may include a semiconductor substrate containing a source region and a drain region spaced apart by a channel region on which a gate electrode may be formed. By applying voltage to the gate electrode, the conductivity of the channel region may increase and allow current to flow from the source region to the drain region.

To allow current to flow between a source region and a drain region (collectively referred to as source/drain regions), electrical contacts need to be formed on the source/drain regions. The source/drain contacts may be formed by etching contact holes in a dielectric layer and filling the contact holes with a conductive material such as a metal. Source/drain contact resistance in a FET is proportional to the size of the contact areas. It is desirable to provide larger contact areas between the bottom of the contacts and the source/drain regions to reduce contact resistance therebetween. The larger contact areas for source/drain contacts may be achieved by forming larger size contact holes. However, a greater amount of conductive material that is needed to fill in the larger size contact holes can result in increased contact capacitance, which tends to impair overall device performance. Therefore, there remains a need to reduce the contact capacitance for source/drain contacts while maintaining low contact resistance.

SUMMARY

The present application provides source/drain contacts that exhibit a reduced contact capacitance without adversely affecting contact resistance. After forming source/drain contact trenches to expose source/drain regions, contact liner material layer portions are formed on sidewalls and bottom surfaces of the source/drain contact trenches. Contact material layer portions are then formed over the contact liner material layer portions to fill in the source/drain contact trenches. At least portions of the contact material layer portions and the contact liner material layer portions present on sidewalls of the source/drain contact trenches are removed to provide source/drain contacts with reduced contact capacitance.

In one aspect of the present application, a method of forming a semiconductor structure is provided. The method includes first forming source/drain regions on opposite sides of at least one gate structure located on a channel region of a semiconductor material layer. Source/drain contact trenches are then formed through a contact level dielectric layer and at least a portion of an interlevel dielectric (ILD) layer underlying the contact level dielectric layer. Each of the source/drain contact trenches exposes at least a portion of one of the source/drain regions. After forming contact liner material layer portions on sidewalls and bottom surfaces of the source/drain contact trenches and contact material layer portions to fill remaining volumes of the source/drain contact trenches, a patterned mask layer is formed to cover portions of contact liner material layer portions and contact martial layer portions in the source/drain contact trenches. Next, at least portions of exposed portions of the contact liner material layer portions present on the sidewalls of the source/drain trenches and exposed portions of the contact material layer portions are removed to provide voids. Dielectric layer portions are then formed to fill the voids.

In another aspect of the present application, a semiconductor structure is provided. The semiconductor structure includes source/drain regions present on opposite sides of at least one functional gate structure located on a channel region of a semiconductor material layer, an interlevel dielectric (ILD) layer laterally surrounding the at least one gate structure and overlying the source/drain regions, a contact level dielectric layer located on the ILD and the at least one functional gate structure, source/drain contacts formed within source/drain contact trenches extending through the contact level dielectric layer and at least a portion of the ILD layer, and dielectric material layer portions laterally surrounding the first portion of each of the source/drain contacts and overlying the second portion of each of the source/drain contacts. Each of the source/drain contacts is in contact with one of the source/drain regions and includes a first portion spanning an entire height of a portion of the one of the source/drain contact trenches and a second portion located at a bottom portion of a remaining portion of the one of the source/drain contact trenches.

DETAILED DESCRIPTION

Figure 1:
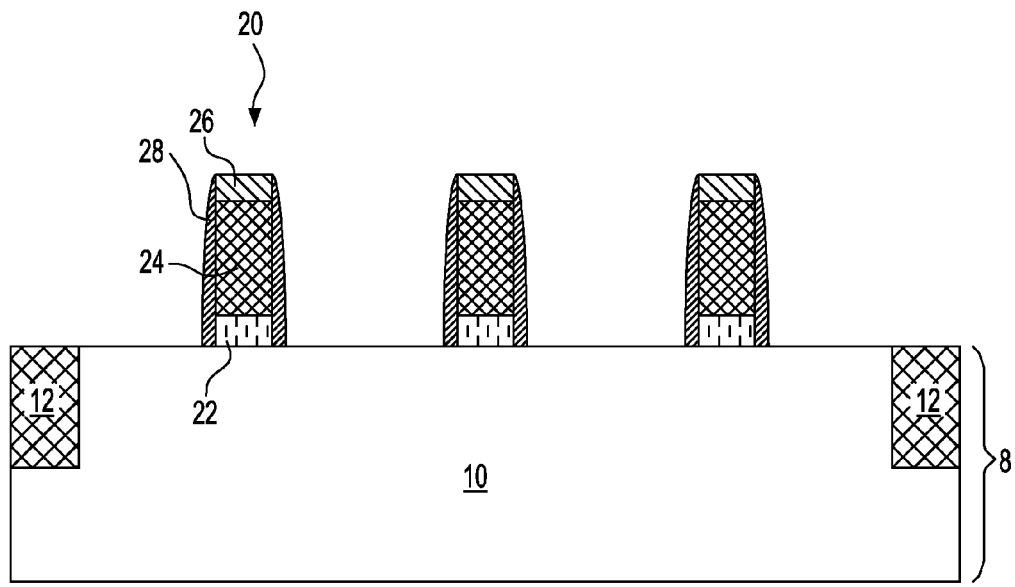
FIG. 1 is a cross-sectional view of an exemplary semiconductor structure including a substrate and sacrificial gate structures formed thereon that can be employed in embodiments of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form source/drain contacts with reduced contact capacitance in a gate-last processing flow for planar FETs, the basic concept of the present application can also be used in a gate-first processing flow. Furthermore, the basic concept of the present application can be applied to form source/drain contacts with reduced contact capacitance in non-planar devices such as FinFETs and nanowire FETs as well.

Referring to FIG. 1, an exemplary semiconductor structure that can be employed in embodiments of the present application includes a substrate 8 and sacrificial gate structures 20 formed thereupon. The substrate 8 can be a semiconductor-on-insulator (SOI) substrate or a bulk semiconductor substrate. The substrate 8 includes a semiconductor material layer 10, which can be a top semiconductor layer of a semiconductor-on-insulator (SOI) substrate or a semiconductor material portion of a bulk semiconductor substrate. Various doped wells (not shown) having p-type or n-type dopants can be formed in the semiconductor material layer 10. Shallow trench isolation (STI) structures 12 including a dielectric material can be formed in the substrate 8 to provide electrical isolation between neighboring semiconductor devices to be formed.

Each sacrificial gate structure 20 includes a vertical stack of a sacrificial gate dielectric 22, a sacrificial gate conductor 24 and a sacrificial gate cap 26. The sacrificial gate structure 20 can be formed by first providing a material stack (not shown) that includes, from bottom to top, a sacrificial gate dielectric layer, a sacrificial gate conductor layer and a sacrificial gate cap layer over the substrate 8. In some embodiments of the present application, the sacrificial gate dielectric layer can be omitted. When present, the sacrificial gate dielectric layer includes a dielectric material such as an oxide or a nitride. In one embodiment, the sacrificial gate dielectric layer can be a layer of silicon oxide, silicon nitride, or silicon oxynitride. The sacrificial gate dielectric layer can be formed by a conventional deposition process, including but not limited to, chemical vapor deposition (CVD) or physical vapor deposition (PVD). The sacrificial gate dielectric layer can also be formed by conversion of a surface portion of the semiconductor material layer 10. The sacrificial gate dielectric layer that is formed may have a thickness from 1 nm to 10 nm, although lesser and greater thicknesses can also be employed.

The sacrificial gate conductor layer can include a semiconductor material such as polysilicon or a silicon-containing semiconductor alloy such as a silicon-germanium alloy. The sacrificial gate conductor layer can be formed using CVD or plasma enhanced chemical vapor deposition (PECVD). The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The material stack can then be patterned by lithography and etching to form the sacrificial gate structure 20. Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as a reactive ion etch (RIE) process. The remaining portions of the material stack after the pattern transfer constitute the sacrificial gate structure 20. The remaining portions of the photoresist layer may be subsequently removed by, for example, ashing.

A gate spacer 28 is formed on each sidewall of the sacrificial gate structures 20. The gate spacer 28 includes a dielectric material such as, for example, an oxide, a nitride, an oxynitride, or any combination thereof. For example, the gate spacer 28 may be composed of silicon nitride, silicon boron carbon nitride (SiBCN), or silicon carbon oxynitride (SiOCN). The gate spacer 28 can be formed by first providing a conformal gate spacer material layer (not shown) on exposed surfaces of the sacrificial gate structures 20 and the substrate 8 and then etching the conformal gate spacer material layer to remove horizontal portions of the conformal gate spacer material layer. The conformal gate spacer material layer can be provided by a deposition process including, for example, CVD, PECVD, or PVD. The etching of the conformal gate spacer material layer may be performed by a dry etch process such as, for example, RIE. The remaining portions of the conformal gate spacer material layer constitute the gate spacer(s) 28. The width of each gate spacer 28, as measured at the base of the gate spacer 28 can be from 5 nm to 100 nm, although lesser and greater widths can also be employed.

Figure 2:
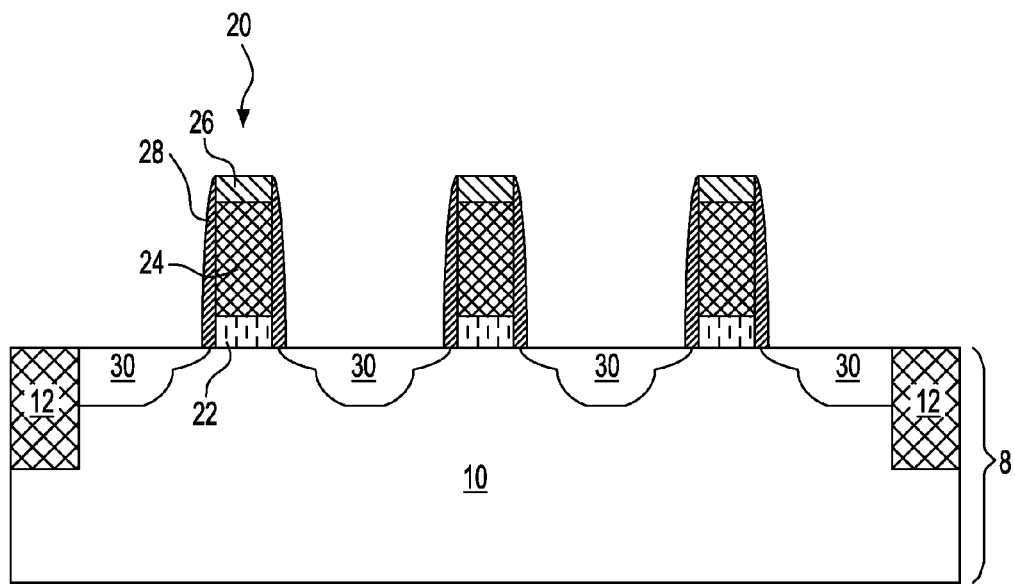
FIG. 2 is a cross-sectional view of the exemplary semiconductor structure of FIG. 1 after forming source/drain regions on opposite sides of the sacrificial gate structures.

Referring to FIG. 2, various source/drain regions 30 are formed on opposite sides of the sacrificial gate structures 20. In one embodiment and as shown in FIG. 2, the source/drain regions 30 are planar source/drain region formed in the semiconductor material layer 10. A source/drain implantation is performed to form source/drain regions 30 in portions of the semiconductor material layer 10 on opposite sides of the sacrificial gate structures 20 using the sacrificial gate structures 20 and the gate spacers 28 as a mask. Each of the remaining portions of the semiconductor material layer 10 that is located beneath a corresponding sacrificial gate structure 20 constitutes a channel region of a FET. The source/drain regions 30 can be formed by implanting dopants of the opposite conductivity type than the conductivity type of the semiconductor material layer 10 using, for example, an ion implantation process, plasma doping, gas phase diffusion, or diffusion from a doped oxide. For n-type FETs, the source/drain regions 30 can be made by implanting an n-type dopant, while for p-type FETs, the source/drain regions 30 can be made by implanting a p-type dopant. Exemplary n-type dopants include, but are not limited to, P, As or Sb. Exemplary p-type dopants include, but are not limited to, B, Al, Ga or In. An activation anneal can be subsequently performed to activate the implanted dopants in the source/drain regions 30.

In another embodiment, the source/drain regions 30 are raised source/drain regions (not shown) formed on the portions of semiconductor material layer 10 on opposite sides of the sacrificial gate structures 20. Raised source/drain region may be formed by selective epitaxy. During the selective epitaxy process, the deposited semiconductor material grows only on exposed semiconductor regions, i.e., portions of semiconductor material layer 10 on opposite sides of the sacrificial gate structures 20 and does not grow on dielectric surfaces, such as surfaces of the sacrificial gate caps 26, the gate spacers 28 and the STI regions 12.

The semiconductor material (i.e., silicon-containing semiconductor material and germanium-containing semiconductor material) of the raised source/drain regions can be deposited as an intrinsic semiconductor material, or can be deposited with in-situ doping. If the semiconductor material is deposited as an intrinsic semiconductor material, the raised source/drain regions can be subsequently doped (ex-situ) utilizing ion implantation, gas phase doping or dopant out diffusion from a sacrificial dopant source material.

Figure 3:
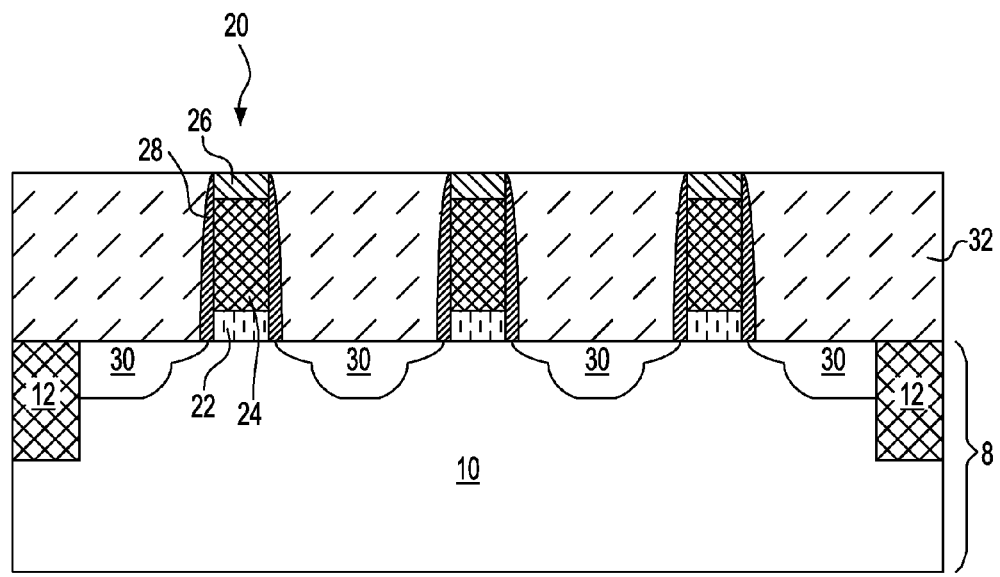
FIG. 3 is a cross-sectional view of the exemplary semiconductor structure of FIG. 2 after forming an interlevel dielectric (ILD) layer laterally surrounding the sacrificial gate structures.

Referring to FIG. 3, an interlevel dielectric (ILD) layer 32 is formed over the sacrificial gate structures 20, the gate spacers 28, the source/drain regions 30 and the STI regions 12. In some embodiments of the present application, the ILD layer 32 is composed of a dielectric material that may be easily planarized. For example, the ILD layer 32 can include a doped silicate glass, an undoped silicate glass (silicon oxide), an organosilicate glass (OSG), a porous dielectric material, or amorphous carbon. The ILD layer 32 can be deposited using a conventional deposition process, such as, for example, CVD, PECVD, sputter deposition, reactive sputter deposition, ion-beam deposition, and evaporation. Following the deposition of the ILD layer 32, the ILD layer 32 can be subsequently planarized, for example, by CMP using topmost surfaces of the sacrificial gate structures 20 as an etch stop so that a top surface of the ILD layer 32 is coplanar with topmost surfaces of the sacrificial gate structures 20. The ILD layer 32 laterally surrounds the sacrificial gate structures 20.

Figure 4:
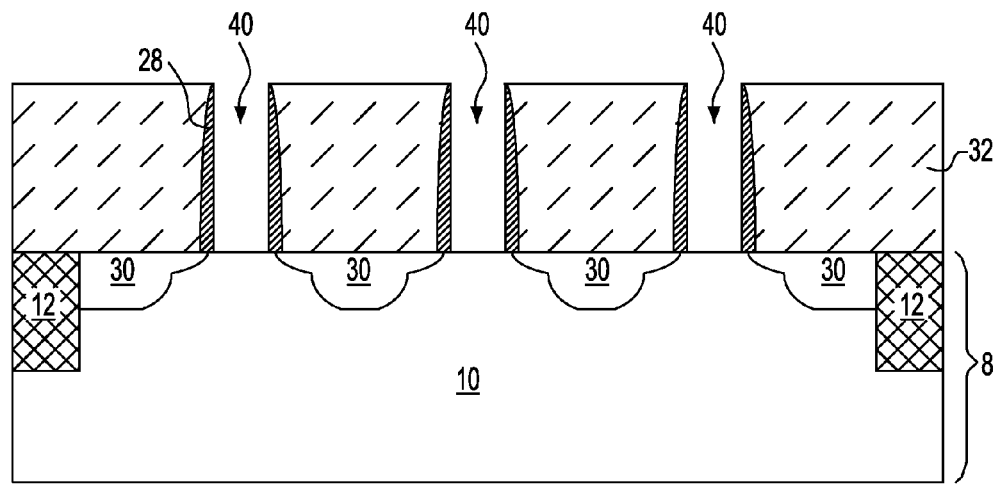
FIG. 4 is a cross-sectional view of the exemplary semiconductor structure of FIG. 3 after removing the sacrificial gate structures to provide gate cavities.

Referring to FIG. 4, the sacrificial gate structures 20 are removed to provide gate cavities 40. The sacrificial gate structures 20 can be removed selectively to the semiconductor material layer 10, the STI regions 12, the gate spacers 28 and the ILD layer 32 using at least one etch. The at least on etch can be a wet chemical etch such as an ammonia etch or a dry etch such as RIE. A gate cavity 40 is thus formed within a volume from which each sacrificial gate structure 20 is removed and is laterally confined by inner sidewalls of the gate spacers 28.

Figure 5:
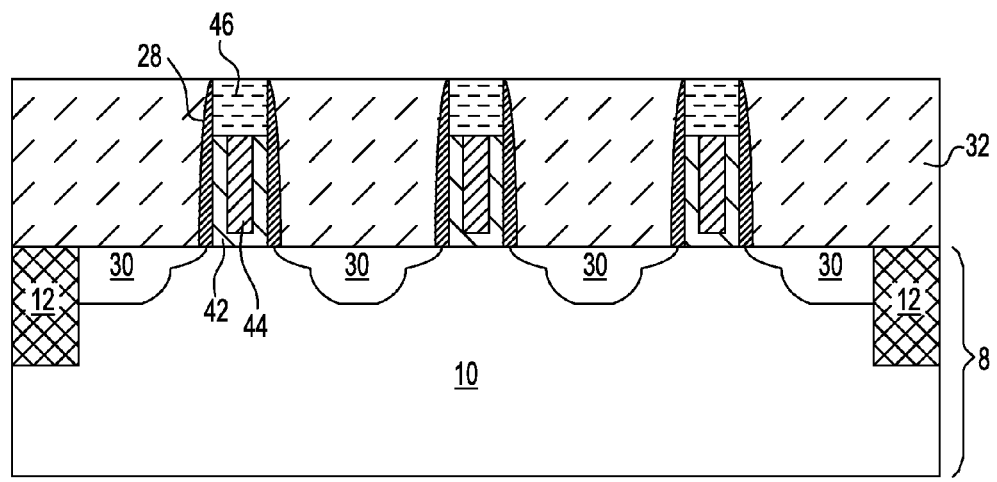
FIG. 5 is a cross-sectional view of the exemplary semiconductor structure of FIG. 4 after forming functional gate structures in the gate cavities.

Referring to FIG. 5, functional gate structures (42, 44, 46) are formed in the gate cavities 40. Each functional gate structures (42, 44, 46) includes, from bottom to top, a gate dielectric 42, a gate electrode 44 and a gate cap 46. The functional gate structures (42, 44, 46) can be formed by first depositing a conformal gate dielectric layer (not shown) on bottom surfaces and sidewalls of the gate cavities 40 and the top surface of the ILD layer 32. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the gate dielectric layer includes $HfO_2$. The gate dielectric layer can be formed by a conventional deposition process including, but not limited to, CVD, PVD, atomic layer deposition (ALD), molecular beam epitaxy (MBE), ion beam deposition, electron beam deposition, and laser assisted deposition. The gate dielectric layer that is formed may have a thickness ranging from 0.9 nm to 6 nm, although lesser and greater thicknesses can also be employed. The gate dielectric layer may have an effective oxide thickness on the order of or less than 1 nm.

Remaining volumes of the gate cavities 40 are then filled with a gate electrode layer (not shown). The gate electrode layer can include any conductive material which may be a doped semiconductor material or a metallic material, such as, for example, tungsten, titanium, tantalum, aluminum, nickel, ruthenium, palladium and platinum. In one embodiment, the gate electrode layer is comprised of tungsten.

The gate electrode layer can be formed utilizing a conventional deposition process including, for example, CVD, PECVD, PVD, sputtering, chemical solution deposition and ALD. When silicon-containing materials are used as the gate electrode layer, the silicon-containing materials can be doped with an appropriate impurity by utilizing either an in-situ doping deposition process or by utilizing deposition, followed by a step such as ion implantation or gas phase doping in which the appropriate impurity is introduced into the silicon-containing material.

The portion of the gate electrode layer formed above the top surface of the ILD layer 32 can be removed, for example, by CMP. The portion of the gate dielectric layer that is formed above the top surface of the ILD layer 32 may also be subsequently removed. In some embodiments and as illustrated, the remaining portions of the gate electrode layer and the remaining portions of the gate dielectric layer may be recessed utilizing a dry etch or a wet chemical etch to provide a void (not shown) in each of the gate cavities 40. The recessed portions of the gate electrode layer constitute gate electrode 44, and the recessed portions of the gate dielectric layer constitute gate dielectric 42.

A gate cap material is then deposited over the gate dielectric 42 and the gate electrode 44 in the gate cavities 40 and planarized to fill voids that are formed after recessing the remaining portions of the gate electrode layer and the remaining portions of the gate dielectric layer. Exemplary gate cap materials include, but are not limited to, silicon nitride, silicon carbide nitride (SiCN), or silicon boron carbonitride (SiBCN). The deposition of the gate cap material can be performed utilizing a conventional deposition process such as, for example, CVD or PECVD. Following the deposition of the gate cap material, the deposited gate cap material can be subsequently planarized, for example, by CMP using the top surface of the ILD layer 32 as an etch stop to provide the gate cap 46. In some embodiments, the gate cap 46 may be omitted.

Figure 6:
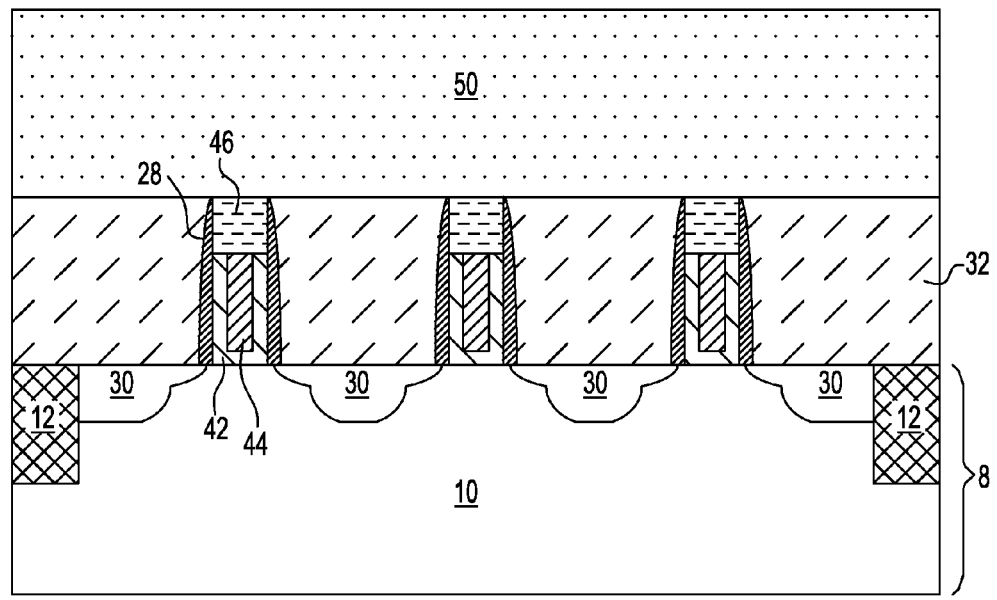
FIG. 6 is a cross-sectional view of the exemplary semiconductor structure of FIG. 5 after forming a contact level dielectric layer over the functional gate structures, gate spacers and the ILD layer.

Referring to FIG. 6, a contact level dielectric layer 50 is deposited over the ILD layer 32, the functional gate structures (42, 44, 46) and the gate spacers 28. The contact level dielectric layer 50 can include a dielectric material such as undoped silicon oxide, doped silicon oxide, porous or non-porous organosilicate glass, porous or non-porous nitrogen-doped organosilicate glass, or a combination thereof. In some embodiments, the contact level dielectric layer 50 may include a same dielectric material as the ILD layer 32. In other embodiments, the contact level dielectric layer 50 may include a different dielectric material from that used in providing the ILD layer 32. The contact level dielectric layer 50 can be formed by CVD, PVD or spin coating. If the contact level dielectric layer 50 is not self-planarizing, the top surface of the contact level dielectric layer 50 can be planarized, for example, by CMP. The planarized top surface of the contact level dielectric layer 50 is located above topmost surfaces of the functional gate structures (42, 44, 46), i.e., the top surfaces of the gate cap 46.

Figure 7A:
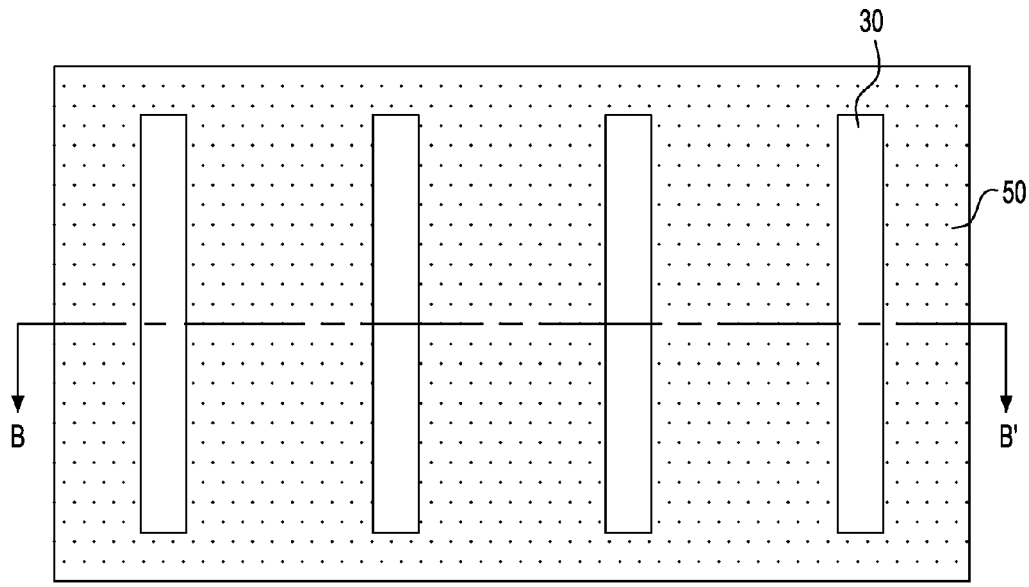
FIG. 7A is a top-down view of the exemplary semiconductor structure of FIG. 6 after forming source/drain contact trenches to expose portions of source/drain regions.
Figure 7B:
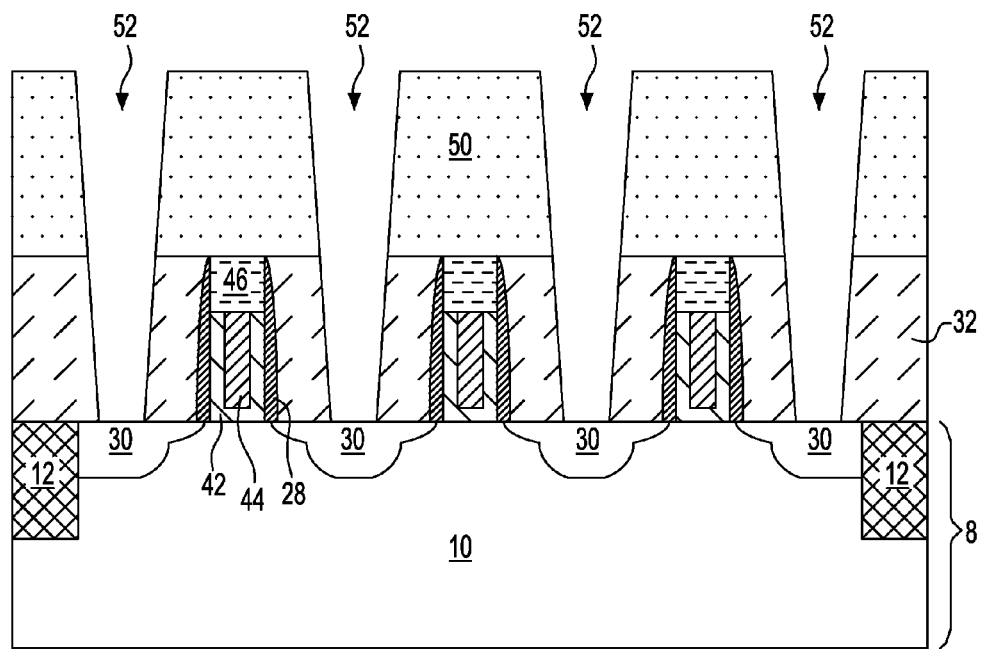
FIG. 7B is a cross-sectional view of the exemplary semiconductor structure of FIG. 7A along line B-B'.

Referring to FIGS. 7A-7B, source/drain contact trenches 52 are formed within the contact level dielectric layer 50 and the ILD layer 32. Each source/drain contact trench 52 exposes a portion of one of the source/drain regions 30. In one embodiment, each source/drain contact trench 52 can expose a majority of an area of one of the source/drain contact trenches 52. The source/drain contact trenches 52 can be formed by applying a mask layer (not shown) over the contact level dielectric layer 50, and then lithographically patterning the mask layer to form openings therein. Each opening overlies a portion of one of the source/drain regions 30. The mask layer can be a photoresist layer or a photoresist layer in conjunction with hardmask layer(s). The pattern in the mask layer is transferred through the contact level dielectric layer 50 and the ILD layer 32 to form the source/drain contact trenches 52. In one embodiment of the present application, a RIE may be performed to remove exposed portions of the contact level dielectric layer 50 and the ILD layer 32 to expose portions of the source/drain regions 30 within the source/drain contact trenches 52. The RIE chemistry is selected depending on the dielectric materials of the contact level dielectric layer 50 and the ILD layer 32. In one embodiment and as shown in FIG. 7B, the source/drain contact trenches that are formed have a tapered shape with sloped sidewalls. After forming the source/drain contact trenches 52, the remaining mask layer can be removed by oxygen-based plasma etching.

Figure 8A:
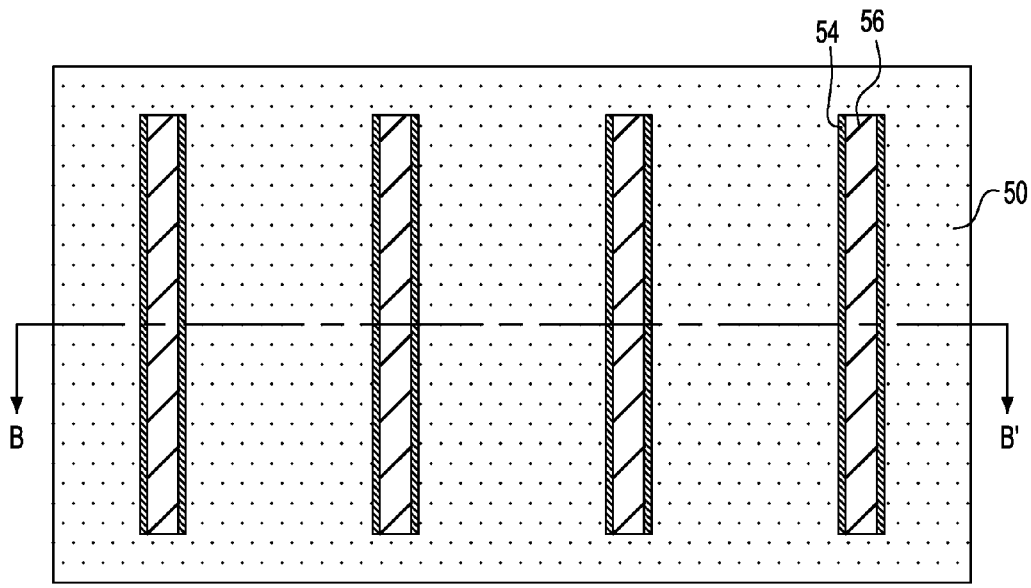
FIG. 8A is a top-down view of the exemplary semiconductor structure of FIG. 7A after forming contact liner material layer portions and contact material layer portions in the source/drain contact trenches.
Figure 8B:
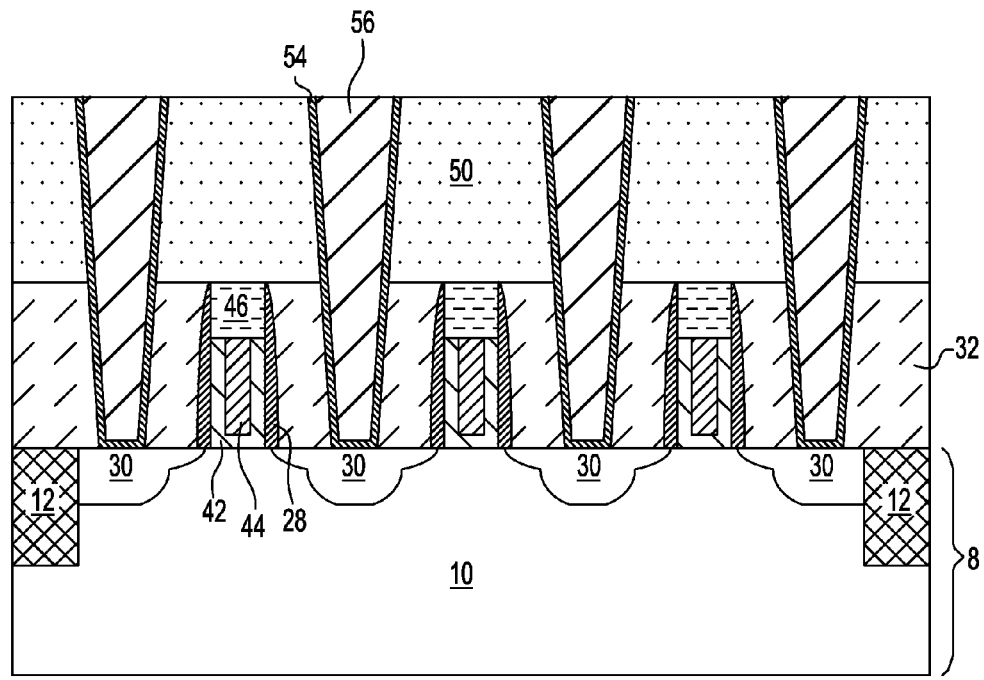
FIG. 8B is a cross-sectional view of the exemplary semiconductor structure of FIG. 8A along line B-B'.

Referring to FIGS. 8A-8B, a conformal contact liner material layer (not shown) is formed on sidewalls and bottom surfaces of the source/drain contact trenches 52 and the top surface of the contact level dielectric layer 50. The contact liner material layer may include titanium, titanium nitride, tantalum, tantalum nitride, nickel, platinum, cobalt, tungsten, rhenium, palladium, erbium, hafnium, lanthanum or their alloys and may be formed utilizing a conformal deposition process including CVD or ALD. The contact liner material layer that is formed can have a thickness ranging from 1 nm to 5 nm, although lesser and greater thicknesses can also be employed.

A contact material layer (not shown) is deposited in the remaining volumes of the source/drain contact trenches 52 until the source/drain contact trenches 52 are completely filled. The contact material layer may include a metal such as, for example, tungsten, aluminum, copper or their alloys. The conductive material layer can be formed by any suitable deposition method such as, for example, CVD, PVD or plating.

Portions of the contact liner material layer and the contact material layer that are located above the top surface of the contact level dielectric layer 50 can be subsequently removed by employing a planarization process, such as, for example, CMP. Remaining portions of the contact liner material layer in the source/drain contact trenches 52 constitute contact liner material layer portions 54, while remaining portions of the contact material layer in the source/drain contact trenches 52 constitute contact material layer portions 56.

FIGS. 9A through 10C are various top and cross-sectional views illustrating steps for forming first exemplary source/drain contacts with reduced contact capacitance from the exemplary semiconductor structure of FIGS. 8A-8B.

Figure 9A:
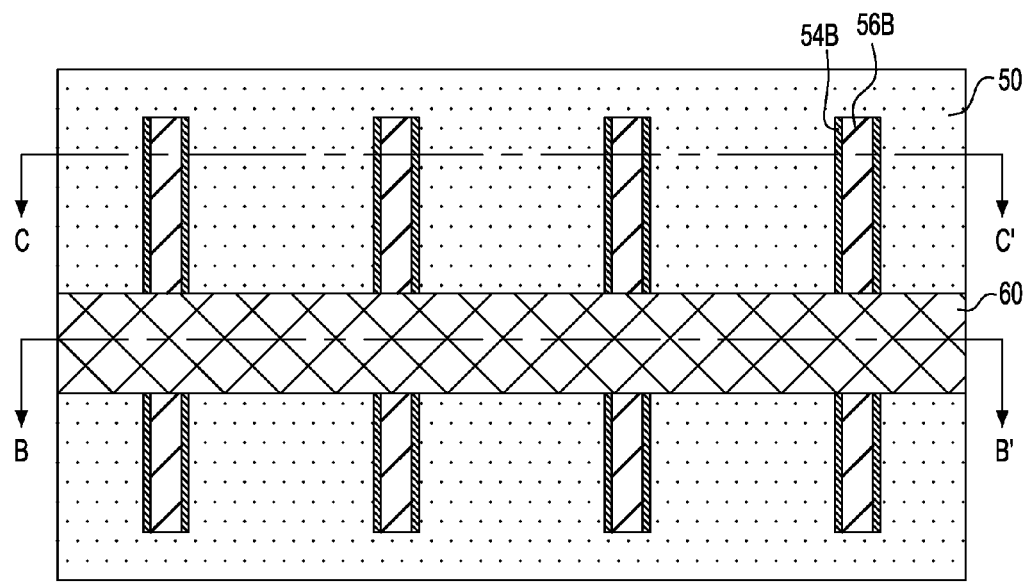
FIG. 9A is a top-down view of a first exemplary semiconductor structure that can be derived from the exemplary semiconductor structure of FIGS. 8A-8B after partially removing portions of the contact liner material layer portions and contact material layer portions that are not covered by a patterned mask layer to provide voids.
Figure 9B:
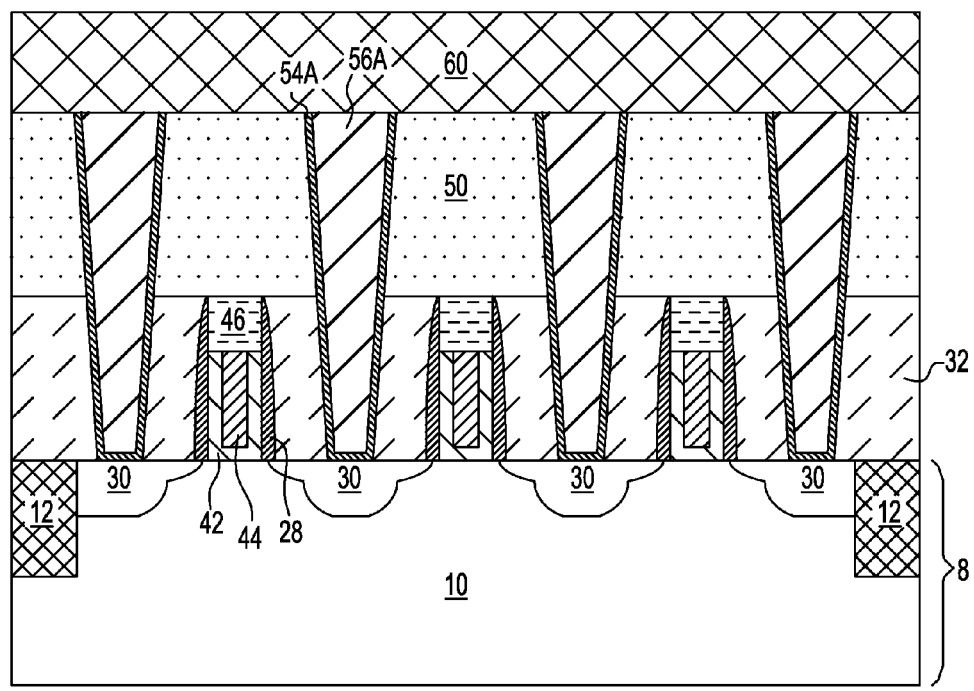
FIG. 9B is a cross-sectional view of the first exemplary semiconductor structure of FIG. 9A along line B-B'.
Figure 9C:
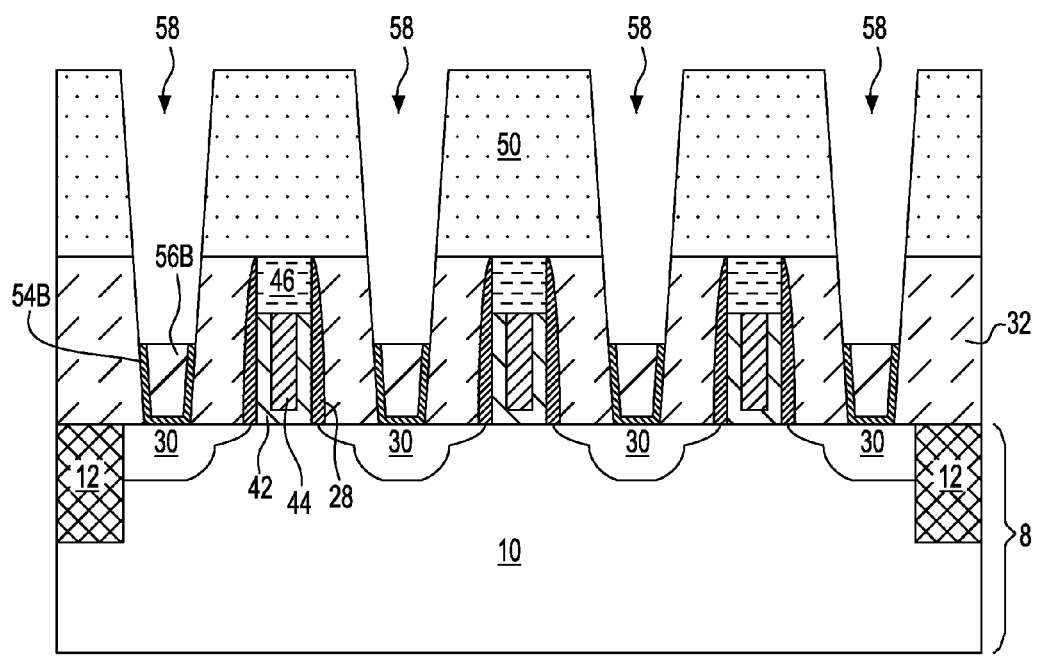
FIG. 9C is a cross-sectional view of the first exemplary semiconductor structure of FIG. 9A along line C-C'.

Referring to FIGS. 9A-9C, a mask layer (not shown) is applied over the contact level dielectric layer 50, the contact liner material layer portions 54 and the contact material layer portions 56 and lithographically patterned so that a patterned mask layer covers portions of the contact liner material layer portions 54 and the contact material layer portions 56 to define interconnect areas for source/drain contact subsequently formed. The mask layer can be a photoresist layer or a photoresist layer in conjunction with hardmask layer(s). Portions of the contact liner material layer portions 54 in the interconnect areas (i.e., covered areas) are herein referred to as contact liners 54A. Portions of the contact material layer portions 56 in the interconnect areas are herein referred to as contact plugs 56A. Each of the contact liners 54A and a corresponding contact plug 56A in one of the source/drain contact trenches 52 constitutes a first portion of a source/drain contact. As shown in FIG. 9B, topmost surfaces of the contact liners 54A and top surfaces of the contact plugs 56A in the first portions (i.e., interconnect portions) of the source/drain contacts are coplanar with the top surface of the contact level dielectric layer 50.

The exposed portions of the contact liner material layer portions 54 and the contact material layer portions 56 may be recessed utilizing a dry etch or a wet chemical etch to provide voids 58. In one embodiment and when the contact material layer is composed of tungsten and the contact liner material layer is composed of titanium nitride, the exposed portions of contact material layer portions 56 may be recessed by a RIE process using $SF_6$, nitrogen and chlorine as an etchant, while the exposed portions of the contact liner material layer portions 54 may be recessed by a wet chemical etch using an alkaline solution (SC-1) including an aqueous mixture of ammonium hydroxide and hydrogen peroxide (e.g., 1:1:5 of 30% $H_2O_2$, 28% $NH_4OH$ and $H_2O$). In one embodiment and as shown in FIG. 9C, the exposed portions of the contact liner material layer portions 54 and the contact material layer portions 56 are partially removed. Topmost surfaces of remaining portions of the exposed portions of the contact liner material layer portions 54 and top surfaces of remaining portions of the exposed portions of the contact material layer portions 56 in the recessed areas are thus located below the top surface of the ILD layer 32. The remaining portions of the exposed portions of the contact liner material layer portions 54 are herein referred to recessed contact liners 54B. The remaining portions of exposed portions of the contact material layer portions 56 are herein referred to as recessed contact plugs 56B. The recessed contact liner 54B and the recessed contact plug 56B located on opposite sides of the first portion of each of the source/drain contacts constitute a second portion of each of the source/drain contacts.

Thus, each of the source/drain contacts (54A, 56A, 54B, 56B) that is in contact with one of the source/drain regions 30 includes a first portion comprising a contact liner 54A present on entire sidewalls and a bottom surface of a portion of one of the source/drain contact trenches 52 and a contact plug 54A present on the contact liner 54A, and a second portion comprising a recessed contact liner 54B present on a lower sidewalls and a bottom surface of a remaining portion of the one of the source/drain contact trenches 52 and a recessed contact plug 56B present on the recessed contact liner 54B.

After forming the source/drain contacts (54A, 56A, 54B, 54B), the patterned mask layer 60 can be removed by oxygen-based plasma etching.

Referring to FIGS. 10A-10D, a dielectric material layer (not shown) is deposited on the resulted semiconductor structure to completely fill the voids 58. The dielectric material layer can include a dielectric material such as undoped silicon oxide, doped silicon oxide, porous or non-porous organosilicate glass, porous or non-porous nitrogen-doped organosilicate glass, or a combination thereof. In one embodiment, the dielectric material layer may include a same dielectric material as the contact level dielectric layer 50. An etch back procedure such as a CMP process or a RIE process may be used to remove the dielectric material layer from the top surface of the contact level dielectric layer 50 to provide dielectric material layer portions 62. Top surfaces of the dielectric material layer portions 62 are coplanar with the top surface of the contact level dielectric layer 50 and topmost surfaces of the source/drain contacts (54A, 56A, 54B, 56B).

In the present application, after removing portions of the contact liner material layer portions 54 and the contact material layer portions 56 from the source/drain contact trenches 52, the contact area of each of the resulting source/drain contacts (54A, 56A, 54B, 56B) remains the same, however the contact capacitance of each of the source/drain contacts (54A, 56A, 54B, 56B) is greatly reduced due to the lesser amount of the contact metal remained in the source/drain contacts (54A, 56A, 54B, 56B). Through the elimination of contact metal in the source/drain contacts, the present application allows the capacitance reduction without impacting the contact resistance.

FIGS. 11A through 12C are various top and cross-sectional views illustrating steps for forming second exemplary source/drain contacts with reduced contact capacitance from the exemplary semiconductor structure of FIGS. 8A-8B.

Figure 11A:
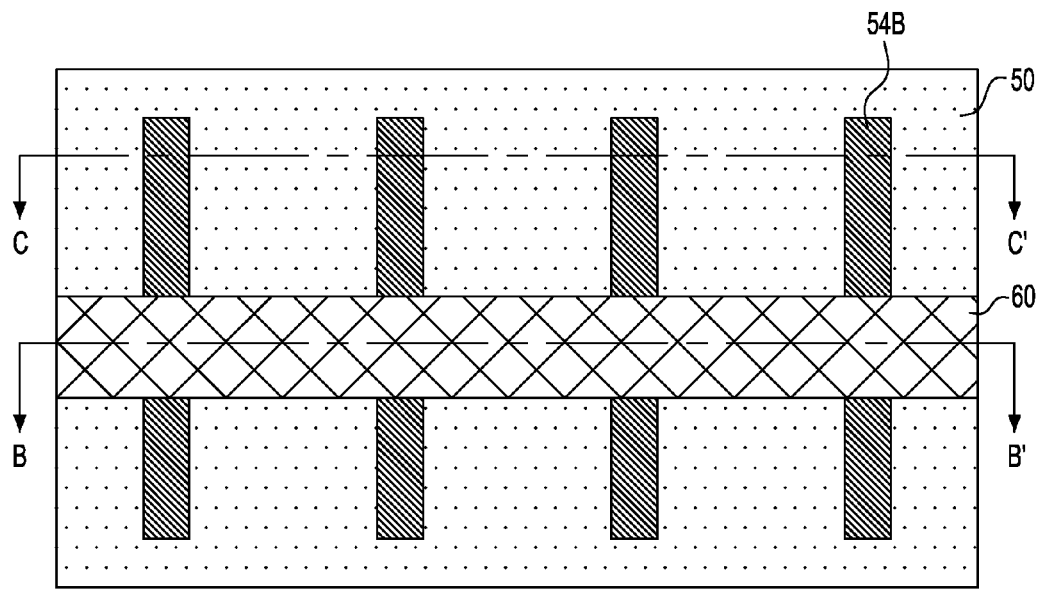
FIG. 11A is a top-down view of a second exemplary semiconductor structure that can be derived from the exemplary semiconductor structure of FIGS. 8A-8B after completely removing portions of the contact liner material layer portions present on sidewalls of the trenches and the contact material layer portions that are not covered by a patterned second mask layer to provide voids.
Figure 11B:
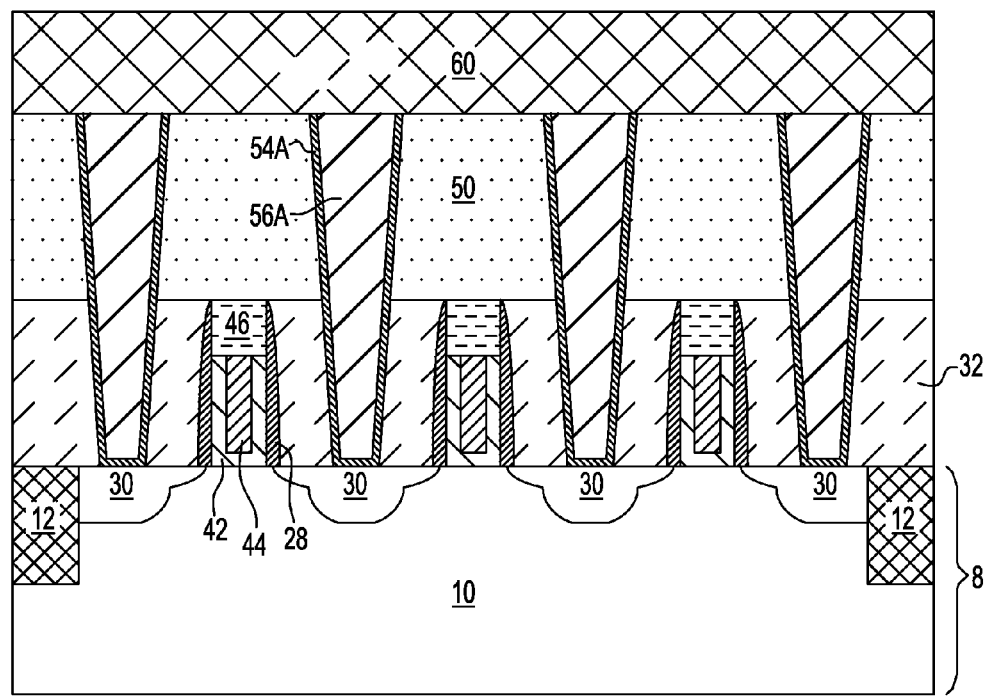
FIG. 11B is a cross-sectional view of the first exemplary semiconductor structure of FIG. 11A along line B-B'.
Figure 11C:
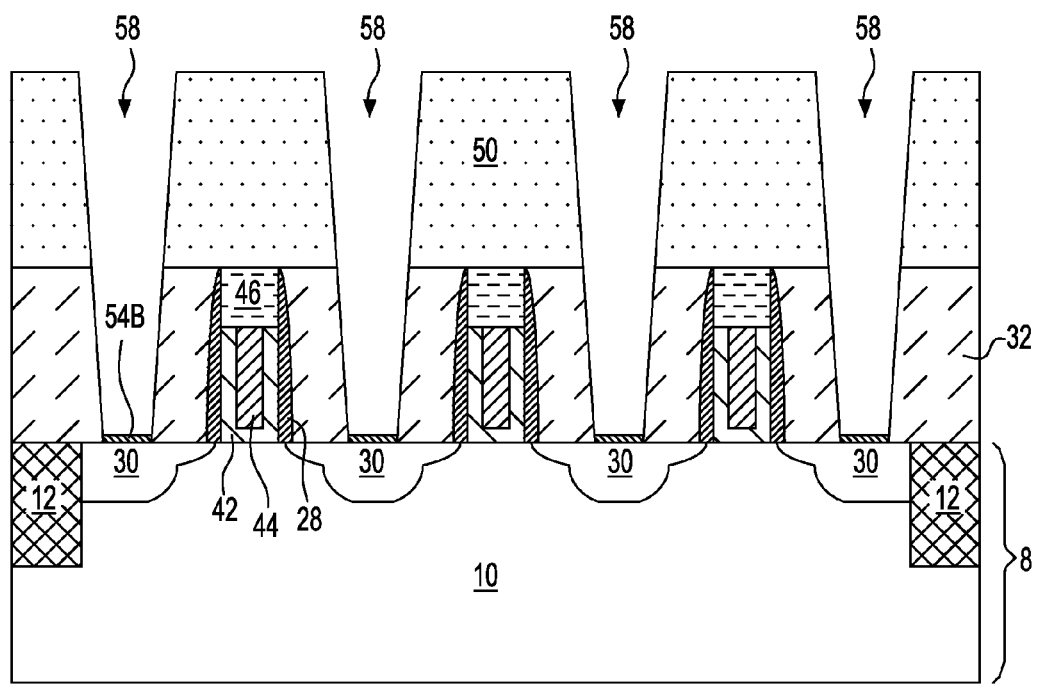
FIG. 11C is a cross-sectional view of the first exemplary semiconductor structure of FIG. 11A along line C-C'.

Referring to FIGS. 11A-11C, a patterned mask layer can be formed by the same processing steps described above with respect to FIGS. 9A-9C to define first portions of the source/drain contacts as shown in FIG. 11B. The exposed portions of the contact liner material layer portions 54 and the contact material layer portions 56 can be recessed by the same processing steps described above with respect to FIGS. 9A-9C. In one embodiment and as shown in FIG. 11C, the exposed portions of the contact material layer portions 56 may be completely removed from the source/drain contact trenches 52. Subsequently, portions of the exposed portions of the contact liner material layer portions 54 that are present on sidewalls of the source/drain contact trenches 52 may be removed to provide voids 58. Horizontal portions of the exposed portions of the contact liner material layer portions 54 are intact. The remaining portions of the contact liner material layer portions 54 in the recessed areas constitute recessed contact liners 54B.

Thus, each of the source/drain contacts (54A, 56A, 54B) that is in contact with one of the source/drain regions 30 includes a first portion comprising a contact liner 54A present on entire sidewalls and a bottom surface of a portion of one of the source/drain contact trenches 52 and a contact plug 56A present on the contact liner 54A, and a second portion comprising a recessed contact liner 54B present a bottom surface of a remaining portion of the one of the source/drain contact trenches 52. The overall contact area for a given source/drain contact (54A, 56A, 54B) are thus provided by the contact liner 54A and the recessed contact liner 54.

Figure 12A:
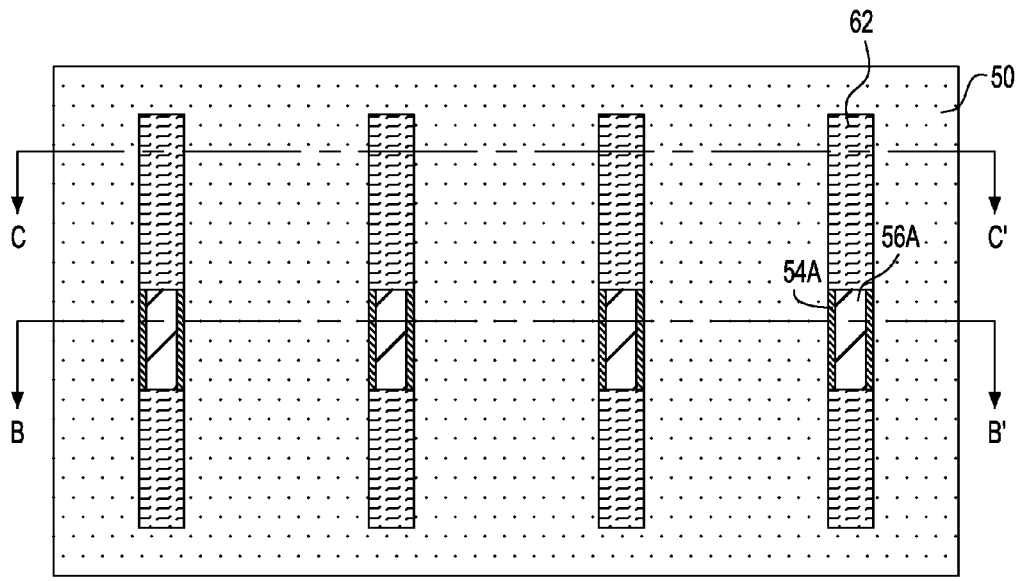
FIG. 12A is a top-down view of the first exemplary semiconductor structure of FIG. 11A after forming dielectric layer portions in the voids.
Figure 12B:
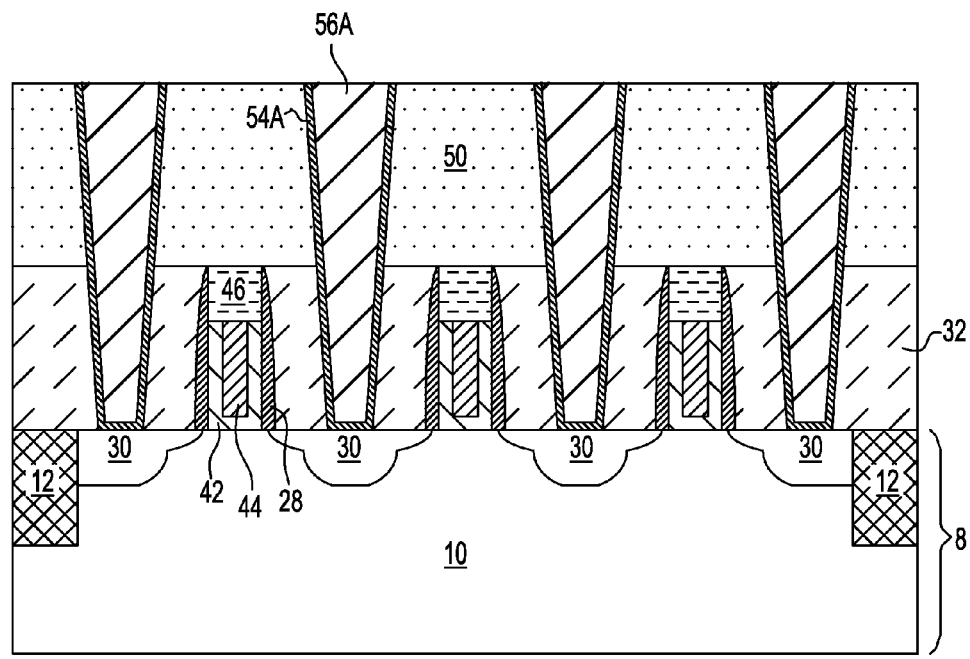
FIG. 12B is a cross-sectional view of the first exemplary semiconductor structure of FIG. 12A along line B-B'.
Figure 12C:
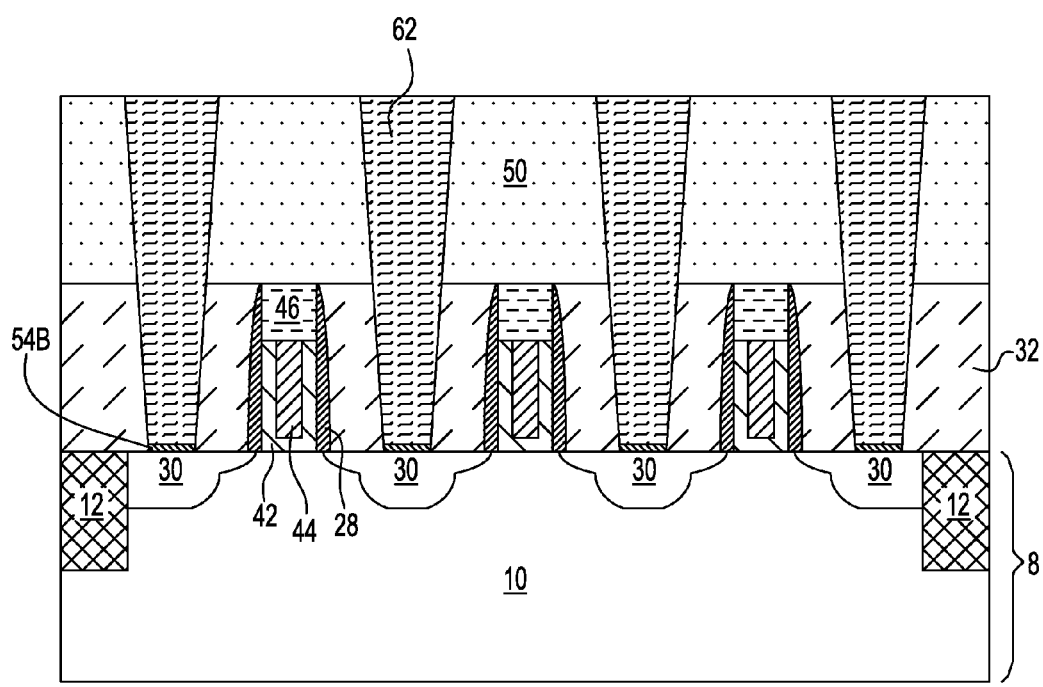
FIG. 12C is a cross-sectional view of the first exemplary semiconductor structure of FIG. 12A along line C-C'.

Referring to FIGS. 12A-12C, the dielectric material layer portions 62 can be formed to a to completely fill the voids 58 utilizing the same processing steps described above with respect to FIGS. 10A-10C.

Figure 10A:
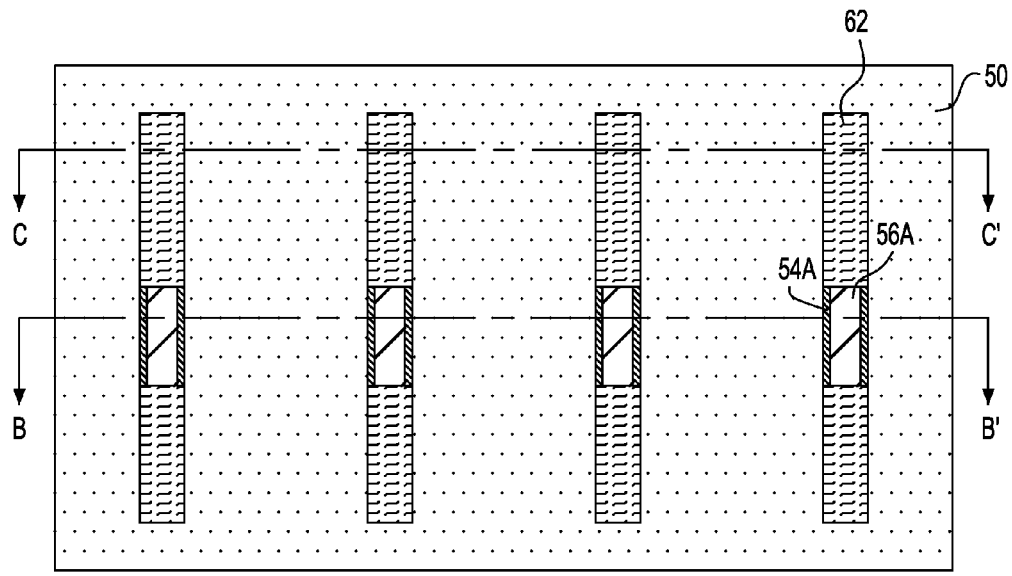
FIG. 10A is a top-down view of the first exemplary semiconductor structure of FIG. 9A after forming dielectric layer portions in the voids.
Figure 10B:
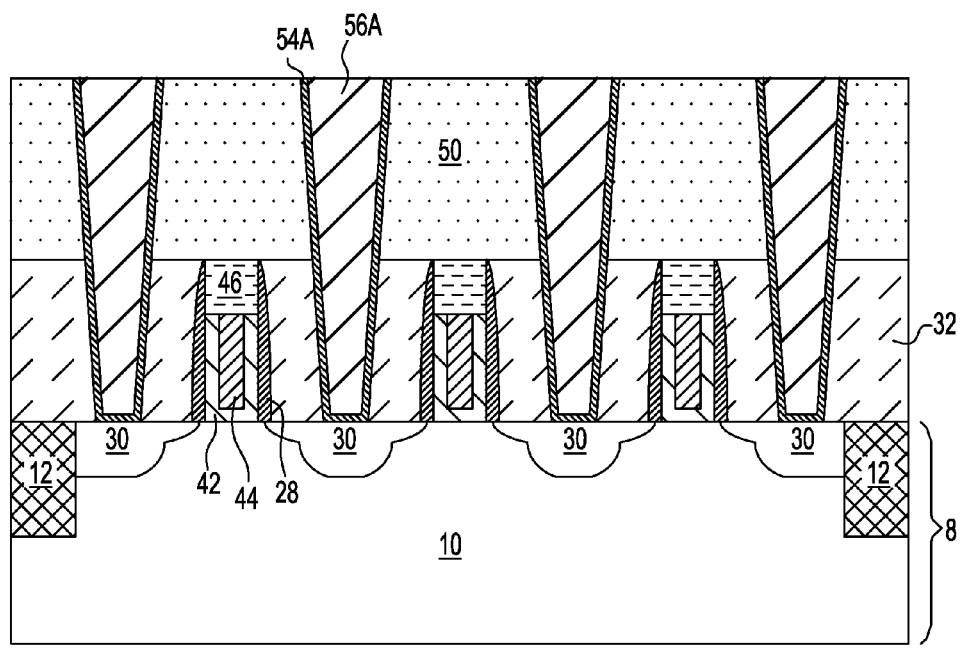
FIG. 10B is a cross-sectional view of the first exemplary semiconductor structure of FIG. 10A along line B-B'.
Figure 10C:
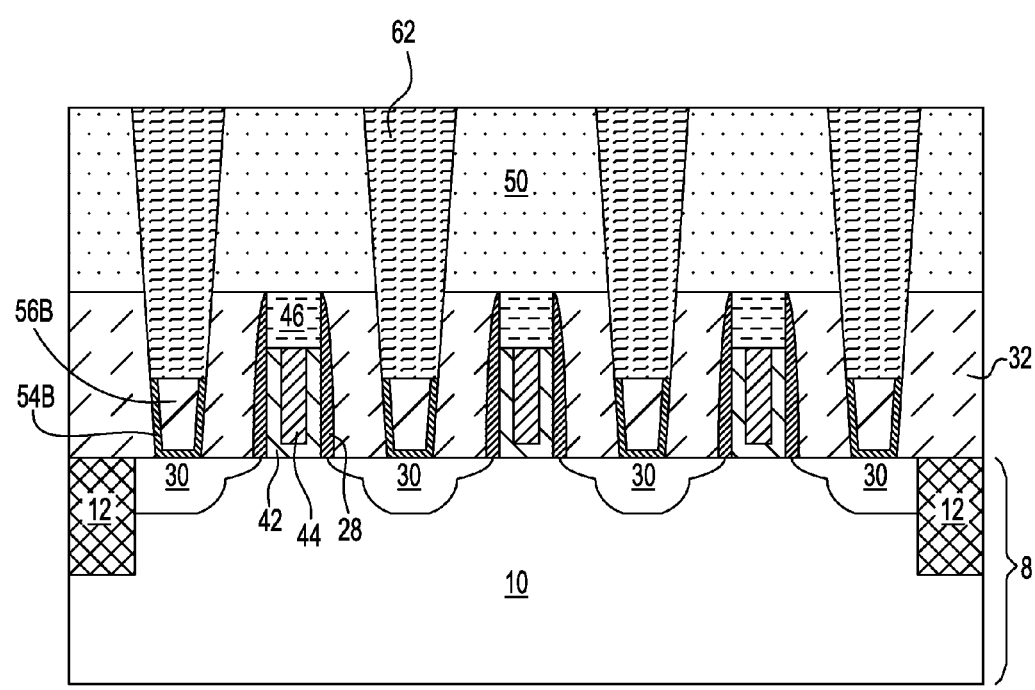
FIG. 10C is a cross-sectional view of the first exemplary semiconductor structure of FIG. 10A along line C-C'.

Comparing to the first exemplary source/drain contacts illustrated in FIGS. 10A-10C, the amount of contact metal in the source/drain contacts (54A, 56A, 56B) of the second exemplary source/drain contacts are further reduced, which may lead a further reduction in the contact capacitance.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming source/drain regions on opposite sides of at least one gate structure located on a channel region of a semiconductor material layer;
    forming source/drain contact trenches through a contact level dielectric layer and at least a portion of an interlevel dielectric (ILD) layer underlying the contact level dielectric layer, each of the source/drain contact trenches exposing at least a portion of one of the source/drain regions;
    forming contact liner material layer portions on sidewalls and bottom surfaces of the source/drain contact trenches;
    forming contact material layer portions to fill remaining volumes of the source/drain contact trenches;

forming a patterned mask layer to cover portions of contact liner material layer portions and contact martial layer portions in the source/drain contact trenches;

removing entire portions of exposed portions of the contact liner material layer portions that are present on the sidewalls of the source/drain contact trenches and entire exposed portions of the contact material layer portions to provide voids; and forming dielectric layer portions to fill the voids.

2. The method of claim 1, wherein the dielectric layer portions are in contact with horizontal portions of the exposed portions of the contact liner material layer portions that remain after the complete removal of the portions of exposed portions of the contact liner material layer portions that are present on the sidewalls of the source/drain contact trenches.

3. The method of claim 1, wherein the source/drain regions are planar source/drain regions, wherein the planar source/drain regions are formed by implanting dopants into portions of the semiconductor material layer on opposite sides of the at least one gate structure.

4. The method of claim 1, wherein the source/drain regions are raised source/drain regions, wherein the raised source/drain regions are formed by epitaxially growing a semiconductor material on portions of the semiconductor material layer on opposite sides of the at least one gate structure.

5. The method of claim 1, further comprising forming the ILD layer laterally surrounding the at least one gate structure.

6. A semiconductor structure comprising:

source/drain regions present on opposite sides of at least one functional gate structure located on a channel region of a semiconductor material layer;

an interlevel dielectric (ILD) layer laterally surrounding the at least one gate structure and overlying the source/drain regions;

a contact level dielectric layer located on the ILD and the at least one functional gate structure;

source/drain contacts formed within source/drain contact trenches extending through the contact level dielectric layer and at least a portion of the ILD layer, wherein each of the source/drain contacts is in contact with one of the source/drain regions and includes a first portion spanning an entire height of a portion of the one of the source/drain contact trenches and a second portion located at a bottom portion of a remaining portion of the one of the source/drain contact trenches; and dielectric material layer portions laterally surrounding the first portion of each of the source/drain contacts and overlying the second portion of each of the source/drain contacts, wherein top surfaces of the dielectric material layer portions are coplanar with a top surface of the first portion of each of the source/drain contacts.

7. The semiconductor structure of claim 6, wherein the source/drain regions are planar source/drain regions embedded in the semiconductor material layer.

8. The semiconductor structure of claim 6, wherein the source/drain regions are raised source/drain regions located on the semiconductor material layer.

9. The semiconductor structure of claim 6, wherein the top surfaces of the dielectric material layer portions are coplanar with a top surface of the contact level dielectric layer.

10. The semiconductor structure of claim 6, wherein the first portion of each of the source/drain contacts comprises a contact liner located on entire sidewalls and a bottom surface of the portion of the one of the source/drain contact trenches and a contact plug overlying the contact liner.

11. The semiconductor structure of claim 10, wherein a topmost surface of the contact liner and a top surface of the contact plug are coplanar with a top surface of the contact level dielectric layer.

12. The semiconductor structure of claim 11, wherein the second portion of each of the source/drain contacts comprises a recessed contact liner located on a bottom surface of the remaining portion of the one of the source/drain contact trenches.

13. The semiconductor structure of claim 12, wherein each of the contact liner and the recessed contact liner comprises titanium, titanium nitride, tantalum, tantalum nitride, nickel, platinum, cobalt, tungsten, rhenium, palladium, erbium, hafnium, lanthanum, or an alloy thereof, and wherein each of the contact plugs comprises tungsten, aluminum, copper, or an alloy thereof.

14. The semiconductor structure of claim 12, wherein an entire bottom surface of each of the dielectric material layer portions is in contact with the recessed contact liner.

15. The semiconductor structure of claim 10, wherein the second portion of each of the source/drain contacts comprises a recessed contact liner located on lower sidewalls and a bottom surface of the remaining portion of the one of the source/drain contact trenches and a recessed contact plug overlying the recessed contact liner.

16. The semiconductor structure of claim 15, wherein a topmost surface of the recessed contact liner and a top surface of the recessed contact plug are located below a top surface of the ILD layer and are in contact with one of the dielectric material layer portions.

17. The semiconductor structure of claim 16, wherein each of the contact liner and the recessed contact liner comprises titanium, titanium nitride, tantalum, tantalum nitride, nickel, platinum, cobalt, tungsten, rhenium, palladium, erbium, hafnium, lanthanum, or an alloy thereof.

18. The semiconductor structure of claim 16, wherein each of the contact plug and the recessed contact plug comprises tungsten, aluminum, copper, or an alloy thereof.

* * * * *